(12) United States Patent
Gonzalez Jimenez

(10) Patent No.: US 9,729,111 B2
(45) Date of Patent: Aug. 8, 2017

(54) METHOD FOR AUTOMATIC IMPEDANCE MATCHING AND CORRESPONDING TRANSMISSION CHANNEL

(71) Applicant: COMMISSARIAT A L'ENERGIE ATOMIQUE ET AUX ENERGIES ALTERNATIVES, Paris (FR)

(72) Inventor: José Luis Gonzalez Jimenez, Voreppe (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/915,079

(22) PCT Filed: Aug. 27, 2014

(86) PCT No.: PCT/EP2014/068159
§ 371 (c)(1),
(2) Date: Feb. 26, 2016

(87) PCT Pub. No.: WO2015/032669
PCT Pub. Date: Mar. 12, 2015

(65) Prior Publication Data
US 2016/0211813 A1 Jul. 21, 2016

(30) Foreign Application Priority Data
Sep. 4, 2013 (FR) ..................... 13 58471

(51) Int. Cl.
*H03F 1/56* (2006.01)
*H03H 7/40* (2006.01)
(Continued)

(52) U.S. Cl.
CPC ............... *H03F 1/56* (2013.01); *H03F 1/301* (2013.01); *H03F 3/21* (2013.01); *H03H 7/40* (2013.01);
(Continued)

(58) Field of Classification Search
CPC ......................................................... H03F 1/56
(Continued)

(56) References Cited

U.S. PATENT DOCUMENTS 4,704,573 A 11/1987 Turner
6,965,837 B2 11/2005 Vintola
(Continued)

OTHER PUBLICATIONS

N. Deltimple et al., "Design of a fully integrated CMOS self-testable RF power amplifier using a thermal sensor," 2012 Proceedings of the ESSCIRC, Sep. 17, 2012, pp. 398-401, XP032466466.
(Continued)

*Primary Examiner* — Patricia T Nguyen
(74) *Attorney, Agent, or Firm* — Baker & Hostetler LLP

(57) ABSTRACT

A method for facilitating the impedance matching of radiofrequency circuits, notably transmission circuits using a power amplifier connected to a load which may include an antenna. A signal is produced for measuring the temperature resulting from the operation of the output amplifier stage, by a temperature sensor positioned in the immediate vicinity of this stage, the measuring signal is used to control a circuit for controlling the variable impedances of a matching network positioned between the amplifier and the load, and values which seek to minimize the sensed temperature are applied to these variable impedances values. An abnormal heating of the amplifier is an indication of an impedance mismatch that must be corrected to restore a minimum temperature.

6 Claims, 2 Drawing Sheets

(51) Int. Cl.
  *H04B 1/04* (2006.01)
  *H04B 1/18* (2006.01)
  *H03F 1/30* (2006.01)
  *H03F 3/21* (2006.01)
(52) U.S. Cl.
  CPC ............ *H04B 1/0458* (2013.01); *H04B 1/18* (2013.01); *H03F 2200/387* (2013.01); *H03F 2200/447* (2013.01)
(58) Field of Classification Search
  USPC ........................................ 330/289, 305, 307
  See application file for complete search history.

(56) References Cited

U.S. PATENT DOCUMENTS

| | | | | |
|---|---|---|---|---|
| 7,071,776 | B2* | 7/2006 | Forrester | H03G 3/001 330/129 |
| 7,221,327 | B2* | 5/2007 | Toncich | G01R 27/2694 333/17.3 |
| 2006/0139089 | A1* | 6/2006 | Bambridge | H01L 24/49 330/65 |
| 2006/0202757 | A1* | 9/2006 | Ichitsubo | H03G 3/3042 330/140 |
| 2007/0139122 | A1* | 6/2007 | Nagarkatti | H03F 1/56 330/302 |
| 2008/0090539 | A1* | 4/2008 | Thompson | H03F 1/02 455/250.1 |
| 2009/0066440 | A1 | 3/2009 | Chan et al. | |
| 2011/0269416 | A1 | 11/2011 | Kadoi et al. | |
| 2012/0075016 | A1 | 3/2012 | Visser et al. | |
| 2013/0069737 | A1* | 3/2013 | See | H04B 1/18 333/32 |
| 2015/0180426 | A1* | 6/2015 | Kingsley | H03F 1/565 330/277 |

OTHER PUBLICATIONS

M. Martin et al., "Thermal Observation of a Modulated Input for a 2.5GHz CMOS Power Amplifier Part 1: Feasibility study," Universitat Politecnica de Catalunya, 2011.

M. Martin et al., "Thermal Observation of a Modulated Input for a 2.5GHz CMOS Power Amplifier Part 2: Temperature Sensor," Universitat Politecnica de Catalunya, 2011.

* cited by examiner

METHOD FOR AUTOMATIC IMPEDANCE MATCHING AND CORRESPONDING TRANSMISSION CHANNEL

CROSS-REFERENCE TO RELATED APPLICATIONS

This application is a National Stage of International patent application PCT/EP2014/068159, filed on Aug. 27, 2014, which claims priority to foreign French patent application No. FR 1358471, filed on Sep. 4, 2013, the disclosures of which are incorporated by reference in their entirety.

FIELD OF THE INVENTION

The invention relates to a method for facilitating the impedance matching of radiofrequency circuits, notably transmission circuits using a power amplifier connected to a load which may include an antenna.

BACKGROUND

In some radiofrequency information transmission applications, it has been noted that the transmit or receive antenna could have an impedance strongly dependent on conditions outside the antenna, and notably dependent on the environment in which the antenna is located.

In medical telemetry, for example, the antenna may need to be inserted into a probe positioned in the human body, and the impedance then depends strongly on the biological environment in which the antenna is located. It depends on the electrical properties (conductivity, dielectric constant) of the surrounding tissues (muscle, fat) or the fluid environment (blood, other fluids) in which the antenna may be immersed.

Even in more conventional radiofrequency transmission applications (mobile telephony, etc.), the impedance of the antenna may vary.

Generally speaking, antenna impedance variations are particularly sensitive for antennas having very small dimensions and a high quality coefficient, used in applications with substantial miniaturization constraints.

These impedance variations may cause mismatch losses. These losses result from the fact that the transmit channel which feeds the antenna, or the receive channel which receives a signal from the antenna, is generally designed to have optimum performance when it is loaded (at the output for the transmit channel or at the input for the receive channel) by a precisely determined nominal impedance; it has reduced performance when it is loaded by an impedance which differs from its nominal value. Mismatch losses may reach 40 dB.

This is why attempts have already been made to interpose an impedance matching network between the output of the transmit channel and the transmit antenna (and this could also be done at the input for a receive antenna), as a result of which the transmit channel sees an impedance which differs from that of the antenna and is preferably equal to the nominal value for which it was designed, for example 100 ohms or 500 ohms. The matching network is tunable, i.e. its capacitive and/or inductive elements have adjustable values to take account of the environmental conditions of the antenna in such a way that the matching is optimum, regardless of the circumstances.

Document US 2012/0075016 discloses an apparatus and a method for impedance matching in which the matching is obtained by adjusting the impedance values of two elements (for example variable capacitors) as a function of a voltage value measured by a peak detector. A temperature measurement allows the introduction of a correction of the impedance values determined in this way.

Document US 2011/0269416 teaches the use of a temperature measurement combined with information relating to a spectral band in order to perform a preliminary adjustment of the impedances of a matching circuit, followed by a fine adjustment which does not implement a temperature measurement. The preliminary adjustment of the impedances uses a simple correlation table.

In patent application US 2009-0066440, a method has been proposed for automatic impedance matching in a transmit or receive channel in which both the amplitude and phase of the current and voltage at the output of the transmit channel (or at the input of the receive channel) are simultaneously detected. The voltage-to-current ratio is representative of the load impedance Zm seen by the channel loaded by the combination of the matching network and the impedance antenna $Z_{ant}$. The load impedance Zm is measured and the antenna impedance $Z_{ant}$ is calculated on the basis of the measured load impedance Zm and the impedances of the matching network, the configuration of which is known at the time of the measurement, and finally the modification that must be applied to one or more of the impedances of the matching network is calculated in order to ensure that the impedance seen by the amplifier becomes matched to the nominal impedance of the amplifier in the current environmental conditions of the antenna.

Document U.S. Pat. No. 4,704,573 discloses a circuit for determining whether the impedance of a load is inside or outside a circle on the Smith chart, characterized by its center and its radius, which may depend on the temperature of an amplifier feeding the load. In this document, as in U.S. Pat. No. 6,965,837, a detection circuit positioned between the amplifier and the load is used to measure the power of the signal at two different locations and deduce therefrom the losses and therefore the better or worse quality of the matching.

These solutions require an electrical contact or an electromagnetic coupling at the output of the amplifier, which may reduce the performance of the latter or the performance of the matching network located downstream of the amplifier.

Generally speaking, mismatch detection circuits themselves influence the matching conditions, which greatly complicates their design. The detection circuit, the matching circuit and the amplifier must be designed at the same time in order to avoid the influence of the detection circuit on the matching.

SUMMARY OF THE INVENTION

According to the invention, a different method is proposed for assisting the impedance matching of the transmission channel.

Instead of detecting electrical signal amplitudes or electromagnetic fields, it is proposed to measure the temperature in the vicinity of the amplifier in order to identify an impedance mismatch in the event of an abnormal increase and correct this mismatch in the sense of seeking to return the temperature to a reference value corresponding to a correct impedance match.

A good impedance matching corresponds in principle to an optimum power transfer from the amplifier to the load. The ratio of the power transmitted to the load to the power dissipated by the amplifier is then the maximum. This ratio is reduced when mismatching occurs, and the amplifier begins to dissipate more power.

This dissipated power variation may be observed indirectly by way of a temperature variation in the immediate vicinity of the amplifier (and more precisely the transistors of the amplifier output stage). A temperature sensor is therefore positioned at this location on the integrated circuit which contains the amplifier.

The temperature which results therefrom and which is given by the sensor can be determined for different load impedances. In operation, the temperature measurement will provide an indication of the degree of mismatching of the existing load impedance. It will then be possible to rectify this mismatch by acting on the matching network inserted between the amplifier and the load (a radiofrequency antenna, for example).

Furthermore, in test mode and with the application of known load impedances to the amplifier output, it will be possible to check that the amplifier is functioning correctly for these different loads, an abnormal temperature for a given load indicating a malfunction.

This impedance matching control technique does not require any electrical contact or electromagnetic coupling; it does not affect the operation of the amplifier or its matching network.

The temperature variations are obviously low-frequency variations (a few kilohertz at most) and they allow the monitoring of the function of an amplifier operating at radiofrequencies (from a few MHz and up to a few GHz).

A method is thus proposed according to the invention for matching the impedance of a transmission channel including an output amplifier stage connected to a load via an impedance matching network including variable impedances, characterized in that a signal is produced for measuring the temperature resulting from the operation of the output amplifier stage, by means of a measuring circuit including a temperature sensor positioned in the immediate vicinity of this stage, the measuring signal is used to control a circuit for controlling the variable impedances of the matching network, and values which minimize or at least seek to minimize the sensed temperature are applied to these variable impedances values.

The transmission channel according to the invention therefore comprises at least one output amplifier stage, a load and an impedance matching network positioned between the amplifier stage and the load, the matching network comprising variable impedances controlled by a control circuit. The channel is characterized in that, on an integrated circuit comprising the output stage, it comprises a measuring circuit comprising a temperature sensor positioned in the immediate vicinity of this output stage, this measuring circuit being connected to the control circuit of the matching network and acting on this control circuit to modify the impedances of the network as a function of the temperature sensed by the sensor.

Two temperature sensors positioned on the integrated circuit are preferably used, one in the immediate vicinity of the output stage and the other more distant. The second sensor provides information relating to the average temperature of the integrated circuit chip in order to provide a reference in relation to which the temperature variations of the first sensor can be analyzed. The means for controlling the impedance matching circuit then act on the basis of the difference between the temperatures supplied by the two sensors.

The matching network may consist of a simple assembly comprising three reactive impedances in the form of a T or Pi, for example one capacitor and two inductors or one inductor and two capacitors. At least one of these impedances is variable, and preferably two of the impedances are variable. Two variable capacitors and one fixed inductor will preferably be used. The matching network may also have several cascaded stages.

BRIEF DESCRIPTION OF THE DRAWINGS

Other characteristics and advantages of the invention will become evident from a reading of the detailed description which follows and which is given with reference to the attached drawings, in which.

DETAILED DESCRIPTION

Figure 1:
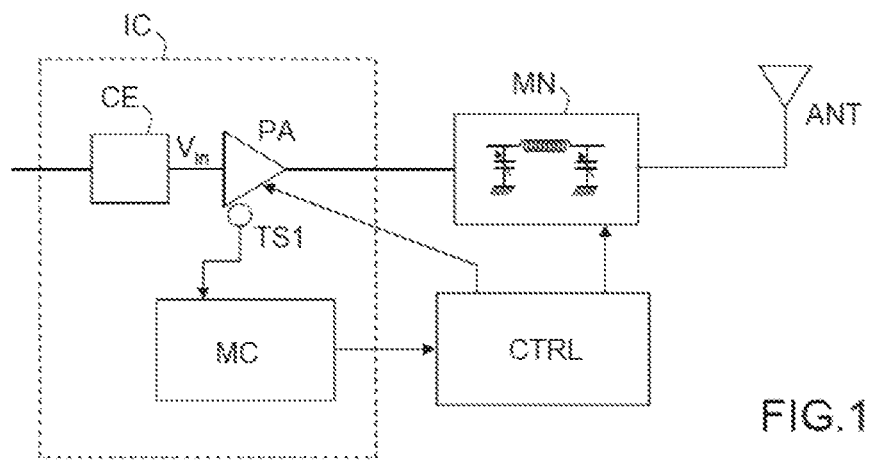
FIG. 1 shows the basic diagram of the invention.

FIG. 1 shows the basic diagram of the invention. The typical example to which the invention is applied is a radiofrequency transmission channel, the output stage of which includes a power amplifier PA receiving signals $V_{in}$ to be amplified and feeding a load which may be an antenna ANT. The output stage amplifier is designed to operate in an optimum manner when the load applied to its output has a nominal impedance $Z_{opt}$ and when the operating frequency is $F_0$, corresponding to a pulse $\omega_0 = 2\pi \cdot F_0$. At high frequency, the impedance $Z_{opt}$ will generally be complex and a function of the frequency.

A matching network MN is inserted in series between the output of the amplifier PA and the antenna ANT. This configuration could also include a filter between the amplifier PA and the network MN and/or a filter between the network MN and the antenna. The matching network consists of inductors and capacitors, of which some values (preferably capacitance values) are adjustable.

The purpose of the matching network MN is to ensure that the amplifier load is equal to the optimum impedance $Z_{opt}$ of the amplifier or is as close as possible to this optimum impedance. The amplifier load essentially consists of the network MN, itself loaded by the antenna ANT.

The simplest implementation of the matching network is a circuit comprising three reactive impedances in the form of a T or Pi, for example one capacitor and two inductors or better one inductor and two capacitors. At least one of these impedances is variable, but in practice two of the impedances will be variable. Two variable capacitors and one fixed inductor will preferably be used, given that it is easier to implement precise variable capacitors than variable inductors. The matching network may also have a plurality of cascaded stages if the mismatch runs the risk of being particularly great. In this case, each stage may consist of a simple assembly comprising three reactive impedances in the form of a T or Pi with, in principle, two variable reactive impedances in each stage.

A control circuit CTRL allows the impedances of the matching network to be modified. It acts to impose required values on the variable impedances of the circuit. For example, if the variable impedances are capacitors, it can be provided that the network comprises a plurality of capacitors of different values; the control circuit CTRL then acts to select a capacitor from the available capacitors. Alternatively, an adjustable-value capacitor can be formed by parallelizing a plurality of capacitors, the values of which represent different loads, wherein the control circuit acts to select those of the capacitors that must be parallelized in order to obtain a required value. A variable capacitor can also be implemented by an element controllable by an electrical voltage (varactor diode for example).

The control circuit CTRL acts under the control of a measuring circuit MC which receives information from a temperature sensor TS1 physically located in the immediate vicinity of the power amplifier PA. The measuring circuit provides information relating to the local temperature variations produced by the amplifier. The power amplifier is formed in an integrated circuit IC, in the same way as the different processing circuits CE which supply the amplifier PA with a radiofrequency input signal to be amplified. The temperature sensor TS1 is positioned in this integrated circuit and close to the amplifier output transistors in such a way as to respond as soon as possible to the temperature variations due to the operation of the amplifier.

The matching network MN and the control circuit CTRL do not necessarily form part of the integrated circuit; they have been shown outside the chip of the integrated circuit IC.

An abnormally high heating of the amplifier produces an abnormal temperature increase in the vicinity of the amplifier PA; this increase is an indication of a possible mismatching of the amplifier. In fact, this mismatching manifests itself as an excessively high consumed power in relation to the transmitted power, i.e. abnormal power losses in the amplifier.

The temperature variations are obviously slow variations which are not affected by a high-frequency modulation due to the amplified signal itself, even if the distance between the power elements which dissipate the heat and the temperature sensor is very short (a few tens or hundreds of micrometers, for example).

The control circuit CTRL receives information representing the temperature in the vicinity of the output stage amplifier from the measuring circuit MC; it runs a search algorithm seeking to minimize the temperature. This algorithm may consist quite simply in a systematic exploration of all the possible values of the variable impedances of the network MN and an observation of the heating in each case. The circuit then makes a decision regarding the choice of variable impedance values which minimizes the heating of the amplifier, as an absolute value if there is only one temperature sensor TS1, as a differential value if there are two sensors TS1 and TS2 at a distance from one another.

The amplifier PA can operate in class A so that the consumed power does not depend on the amplified signal level. Otherwise, the optimum matching search algorithm is run in prior calibration mode, with a constant input signal level.

Figure 2:
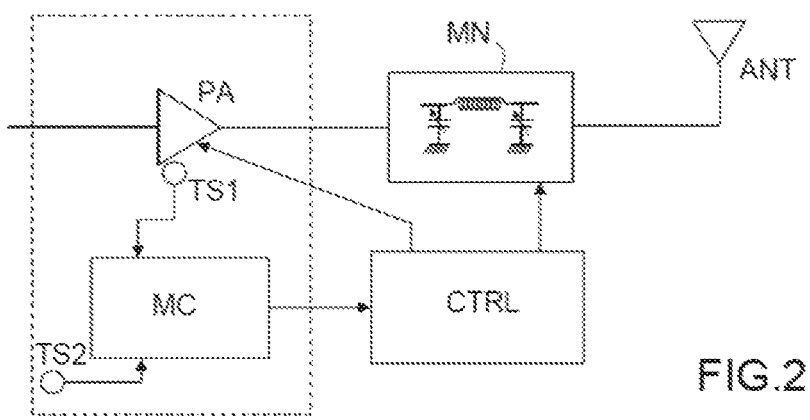
FIG. 2 shows a refinement with two temperature sensors.

As shown in FIG. 2, the measuring circuit MC preferably uses two temperature sensors positioned on the integrated circuit, one (TS1) in the immediate vicinity of the power amplifier, the other (TS2) distant from the amplifier, at a location where the dissipation variations of the amplifier do not affect or only very slowly affect the local temperature. The measuring circuit MC is then a differential circuit which supplies a signal which is a function (preferably a proportional function) of the difference between the local temperature of the amplifier stage, measured by the sensor TS1, and the average temperature of the integrated circuit chip, measured by the sensor TS2. The signal supplied by the measuring circuit does not therefore depend on the temperature conditions associated with the environment, but only on the actual operation of the transmission channel.

Figure 3:
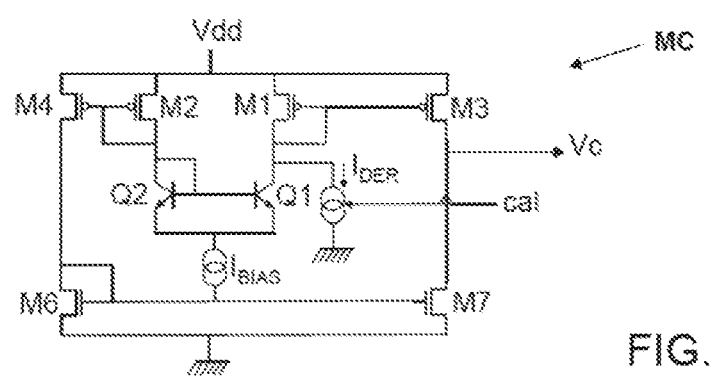
FIG. 3 shows a temperature-sensing circuit usable in the method according to the invention.

FIG. 3 shows an example of a measuring circuit MC operating in a differential manner with two transistors NPN Q1 and Q2 which make up the two temperature sensors TS1 and TS2 respectively. The transistors Q1 and Q2 are located physically at a distance from one another in the integrated circuit, as explained with reference to FIG. 2, FIG. 3 showing only the basic electrical diagram of the connections of the different elements. The transistors Q1 and Q2 are mounted in two differential branches fed by a common current $I_{BIAS}$. The two transistors have their bases interconnected and their emitters interconnected. The current-voltage characteristics of the transistors vary as a function of the temperature, in such a way that, for the same base-emitter voltage, the collector currents of the two transistors are different if their temperatures are different, the sum of these currents remaining constant. The transistor Q2 is diode-connected, i.e. its base is connected to its collector.

The load in series with the collector of the transistor Q2 is a diode-connected PMOS transistor M2 (collector and bass connected). The current of the transistor M2 is copied by a PMOS transistor M4 which feeds a diode-connected NMOS transistor M6. The current of the transistor M6 is copied by an NMOS transistor M7.

Similarly, the collector load of the transistor Q1 is a diode-connected PMOS transistor M1. The current of the transistor M1 is copied by a PMOS transistor M3 which is in series with the transistor M7. The junction point of the transistors M3 and M7 makes up the output of the monitoring circuit. It supplies a control voltage Vc representing the unbalance of the currents passing through the transistors Q1 and Q2, i.e. the unbalance of the temperatures of the two transistors. This control voltage represents the temperature information (here differential information).

The response curve of this measuring circuit (curve of the output voltage Vc as a function of the temperature difference T1-T2 between the two measuring points) can be adjusted by shunting a current $I_{DER}$ of the collector of the transistor Q1 to ground. The adjustment of this shunt current $I_{DER}$ by a calibration signal (cal) enables modification of the range of temperature differences in which the circuit supplies a more or less linear response as a function of the temperature difference. The linear response is, for example, around 0.2V/° C. in the range where T1-T2 goes from 2 to 5° for a certain value of $I_{DER}$ and from 0.2V/° C. in the range from 5 to 8° C. for a different value of $I_{DER}$. The shunt current source may be a simple NMOS transistor, the adjustment of the current being made by the adjustment of the voltage applied between the gate and the source of the transistor.

The measuring circuit shown in FIG. 3 is given simply by way of example, and other circuits could also provide a voltage or a current as a function of a temperature difference existing between two points of the integrated circuit.

Figure 4:
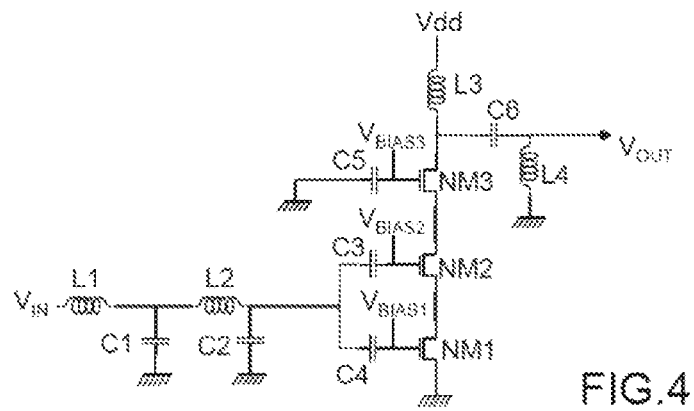
FIG. 4 shows a power amplifier to which the invention can be applied.

FIG. 4 shows an example of a radiofrequency power amplifier PA to which the invention can be applied. This amplifier is described in detail in the article by N. Deltimple, J. L. Gonzalez, J. Altet, Y. Luque and E. Kerherve, "Design of a fully integrated CMOS self-testable RF power amplifier using a thermal sensor" *Proceedings of the ESSCIRC* 2012, 17-21 Sep. 2012, pp. 398-401.

The amplifier includes an input filter which is a bandpass filter in the frequency range to be amplified; in this example, the filter is made up of two inductors L1 and L2 in series, two capacitors C1 and C2 connecting the ends of the inductor L2 to ground, and two decoupling capacitors C3 and C4. The input impedance seen from the input of this filter is 50 ohms and the voltage to be amplified is applied to the input $V_{IN}$ of the filter. The decoupling capacitors C3 and C4, connected on the one hand to the inductor L2 and to the capacitor C2, are furthermore connected to the two NMOS transistor gates NM1 and NM2 respectively. These transistors are in series. The gates are biased by continuous bias voltages $V_{BIAS1}$ and $V_{BIAS2}$. The combination in series of the transistors NM1 and NM2 is in series with an NMOS cascode transistor NM3 also, the gate of which is biased by a continuous voltage $V_{BIAS3}$, and with an inductor L3 connected to a supply voltage Vdd. The transistor NM3 plays a role of level translator. The gate of NM3 can be connected to ground via a decoupling capacitor C5. The junction point between the drain of the transistor NM3 and the inductor L3 is connected to a combination in series of a capacitor C6 and an inductor L4 connected to ground. The output $V_{OUT}$ of this power stage, filtered by the high-pass filter C6, L4, is taken at the junction point between the capacitor C6 and the inductor L4. The output impedance of this power stage is 50 ohms.

The temperature sensor TS1 shown in FIG. 2 and which may be the transistor Q1 shown in FIG. 3 is positioned physically in the immediate vicinity of the transistors NM1 and NM2. The temperature sensor TS2 is positioned at a different location of the integrated circuit chip, distant from the transistors NM1 and NM2.

The principle of the invention was tested by connecting the amplifier output PA shown in FIG. 4 to a variable impedance, modeling the effect of the modification of a matching network MN in the presence of a fixed antenna impedance.

Figure 5A:
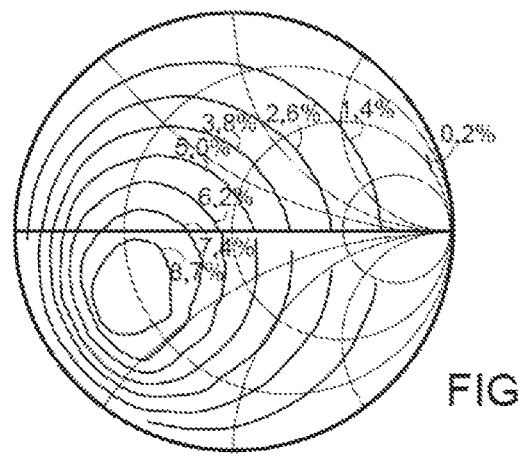
FIGS. 5A and 5B show an experimental validation of the principle of the invention.

FIG. 5A is a Smith chart normalized in relation to a 50 Ohm impedance on which approximately circular curves are plotted, corresponding to respective amplifier efficiency values. In other words, each curve is obtained by interconnecting points which represent load impedance values resulting in the same amplifier inefficiency. The innermost curve corresponds to the best impedance matching, and therefore the highest efficiency (8.7%).

Figure 5B:
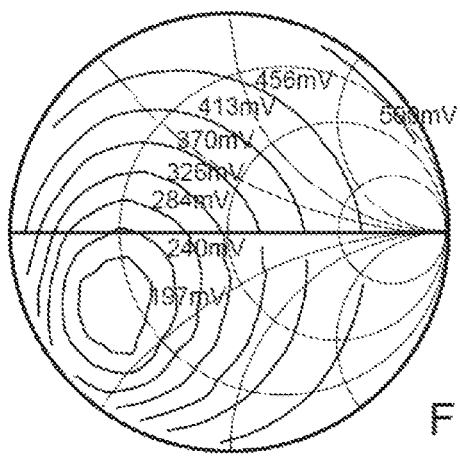

FIG. 5B is a Smith chart, similarly normalized in relation to a 50 Ohm impedance on which approximately circular curves are plotted, corresponding to respective voltage values at the output of the temperature sensor TS1. In other words, each curve is obtained by interconnecting points which represent load impedance values resulting in the same measured temperature. The innermost curve corresponds to the lowest output voltage of the sensor (197 mV), and therefore the lowest measured temperature.

It can be checked through comparison between FIGS. 5A and 5B that the highest efficiency is achieved for the impedance values which minimize the measured temperature, thereby validating the principle on which the invention is based. Furthermore, FIG. 5B shows that the temperature is a convex function of the complex impedance, thus enabling the application of well-known convex optimization algorithms in order to implement the impedance matching.

The invention claimed is:

1. A method of matching an impedance of a transmission channel having an output amplifier stage connected to a load via a matching network having a variable impedance, the method comprising:
    measuring a temperature of the output amplifier stage with a temperature sensor to produce a measuring signal;
    supplying the measuring signal to an input of a control circuit to control the variable impedance of the matching network; and
    varying said variable impedance with the control circuit to minimize said temperature.

2. The method of claim 1, further comprising measuring a second temperature of an integrated circuit containing the output amplifier stage with a second temperature sensor positioned more distant from the output amplifier stage than the temperature sensor, wherein the measuring signal is based on a difference between the temperature and the second temperature.

3. A transmission channel comprising:
    an integrated circuit comprising at least one output amplifier stage;
    a measuring circuit comprising a temperature sensor configured to measure a temperature of the at least one output amplifier stage; and
    a matching network positioned between the at least one output amplifier stage and a load, the matching network comprising a variable impedance and a control circuit wherein said control circuit is configured to receive a temperature measuring signal generated by said measuring circuit and to vary said variable impedances of said matching network to minimize the measured temperature.

4. The transmission channel of claim 3, further comprising a second temperature sensor positioned on the integrated circuit and distanced from the at least one output amplifier stage, wherein the measuring circuit is configured to generate a signal representing a difference in temperature sensed by the temperature sensor and the second temperature sensor.

5. The transmission channel of claim 3, wherein the matching network comprises three reactive impedances in a form of a T or Pi, at least one of the reactive impendences being variable.

6. The transmission channel of claim 4, wherein the matching network comprises three reactive impedances in a form of a T or Pi, at least one of the three reactive impedances being variable.

* * * * *